United States Patent
Makishima

(10) Patent No.: US 7,408,389 B2
(45) Date of Patent: Aug. 5, 2008

(54) OUTPUT CIRCUIT WITH SIGNAL LEVEL SHIFT

(75) Inventor: Hitoshi Makishima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 224 days.

(21) Appl. No.: 11/000,081

(22) Filed: Dec. 1, 2004

(65) Prior Publication Data

US 2005/0156636 A1  Jul. 21, 2005

(30) Foreign Application Priority Data

Jan. 15, 2004  (JP) ............................. 2004-007977

(51) Int. Cl.
*H03K 3/00* (2006.01)
(52) U.S. Cl. .................... 327/112; 327/108; 327/333; 326/80
(58) Field of Classification Search ................ 327/108, 327/109, 110, 111, 112, 333; 326/80, 81, 326/82, 83
See application file for complete search history.

(56) References Cited

U.S. PATENT DOCUMENTS

| 4,855,618 A | 8/1989 | Brokaw |
| 4,890,010 A * | 12/1989 | Neudeck et al. ............ 327/108 |
| 5,736,774 A | 4/1998 | Fujihira |
| 6,307,401 B1 * | 10/2001 | Bridgewater, Jr. ............ 326/86 |
| 6,400,212 B1 * | 6/2002 | Sakurai ....................... 327/539 |

FOREIGN PATENT DOCUMENTS

| EP | 0 294 882 A2 | 12/1988 |
| EP | 0 561 469 A2 | 9/1993 |
| JP | 3-106115 | 5/1991 |
| JP | 05-316755 | 11/1993 |
| JP | 2001-147243 | 5/2001 |
| JP | 2002-026714 | 1/2002 |
| JP | 2003-032102 | 1/2003 |

OTHER PUBLICATIONS

European Office Action for Corresponding Application 10 2004 055 452.8-32 Issued Feb. 8, 2007.

* cited by examiner

*Primary Examiner*—Quan Tra
*Assistant Examiner*—Khareem E. Almo
(74) *Attorney, Agent, or Firm*—McDermott Will & Emery LLP

(57) ABSTRACT

In a level shifting circuit, by supplying current to a gate resistor, a bias is applied to a gate of a transistor. Further, current corresponding to the current which flowed through the gate resistor flows through a first current path of a current mirror circuit, and the current mirror circuit functions to supply current corresponding to the current which flowed through the gate resistor to a source of the transistor. Therefore, current corresponding to the current which flowed through the gate resistor is supplied to an output resistor and it is possible to output a voltage in response to a voltage drop related to the supplied current. Therefore, level shifting can be performed to an input signal for outputting.

6 Claims, 6 Drawing Sheets

F I G. 1
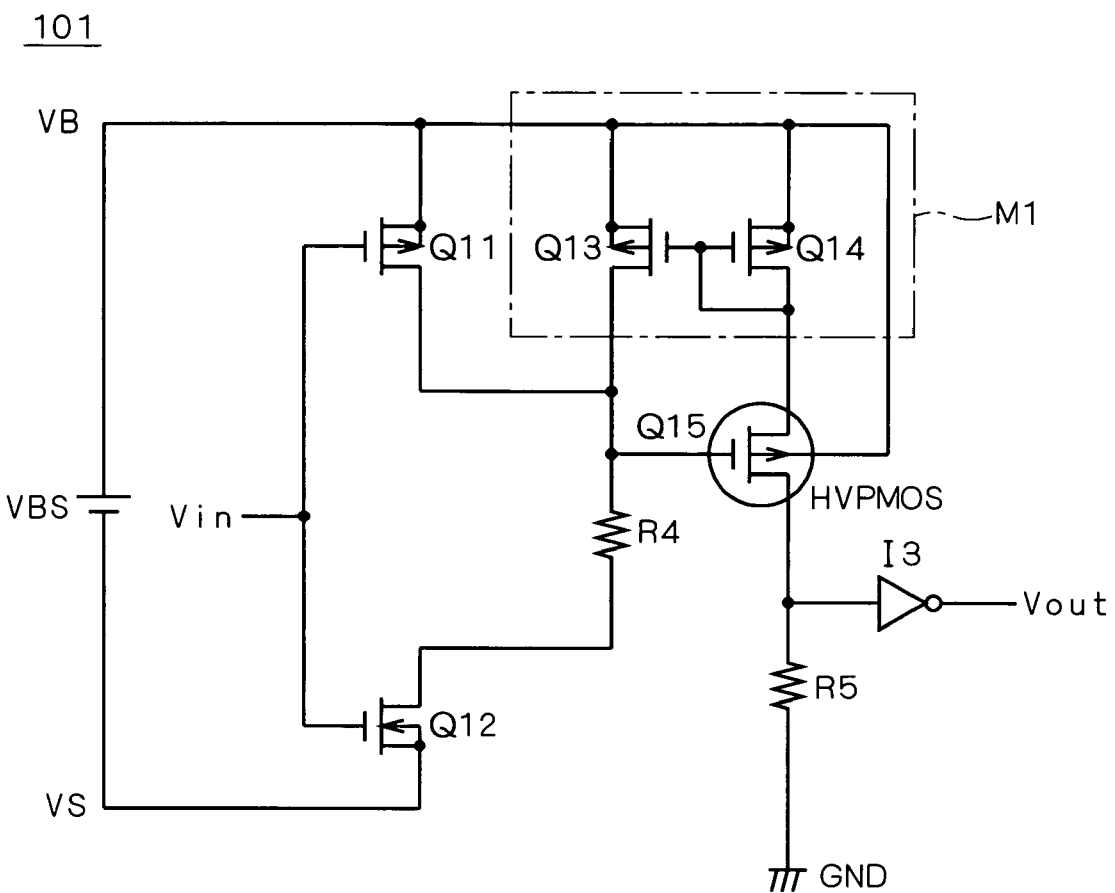

F I G . 4
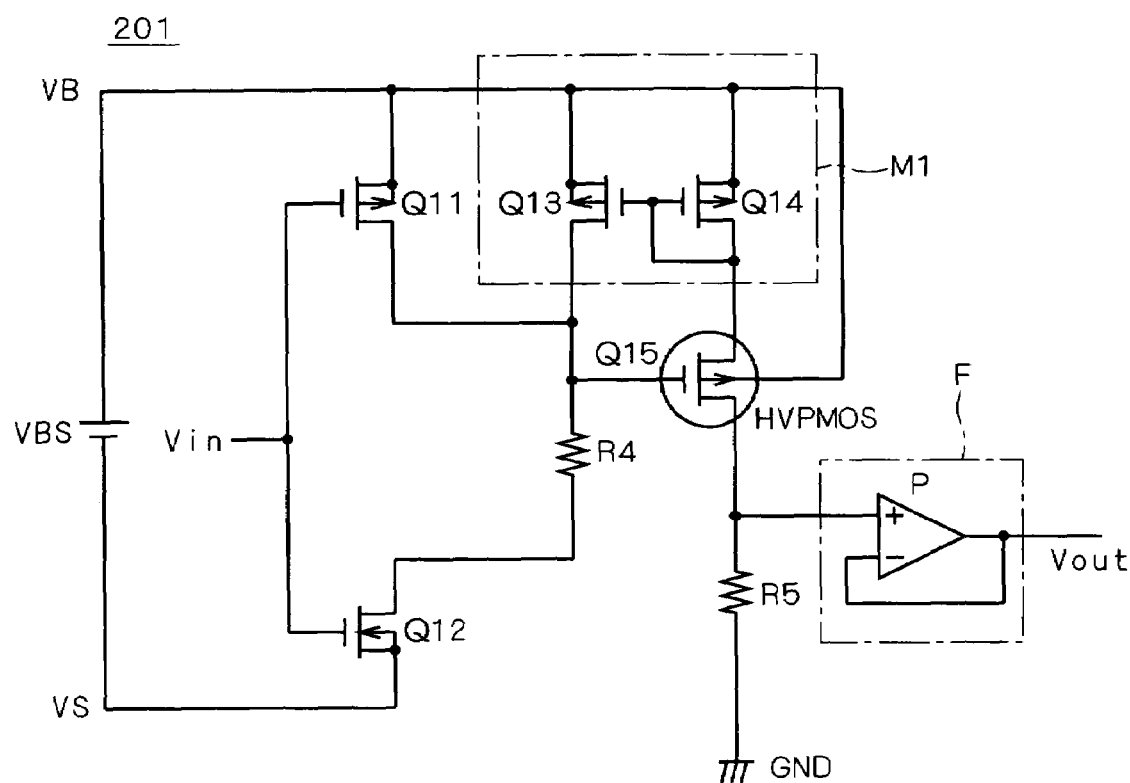

OUTPUT CIRCUIT WITH SIGNAL LEVEL SHIFT

BACKGROUND OF THE INVENTION

1. Field of the Invention

The present invention relates to an output circuit, which is applicable, for example, to a technique for shifting signal levels.

2. Description of the Background Art

A circuit for shifting signal levels, commonly called as level shifting circuit or inverse level shifting circuit, is discussed in Japanese Patent Application Laid-Open No. 05-316755, Japanese Patent Application Laid-Open No. 2003-032102, Japanese Patent Application Laid-Open No. 2002-026714 and Japanese Patent Application Laid-Open No. 2001-147243. Especially, Japanese Patent Application Laid-Open No. 05-316755 and Japanese Patent Application No. 2003-032102 introduce a technique utilizing a mirror circuit.

SUMMARY OF THE INVENTION

An object of the present invention is to provide a technique to omit or reduce the number of high breakdown voltage switching elements employed in part of a mirror circuit, thereby simplifying the circuit configuration.

An output circuit according to the present invention includes a first current mirror circuit, a first PMOS transistor, a first gate resistor and an output resistor.

The first current mirror circuit has first and second current paths. Each of the first and second current paths is connected to a potential point at high potential side.

A source of the first PMOS transistor is connected to the potential point at high potential side through the second current path of the first current mirror circuit. A back gate of the first PMOS transistor is connected to the potential point at high potential side. The first PMOS transistor also has a drain and a gate.

The first gate resistor is connected to the gate of the first PMOS transistor.

The output resistor is connected between the drain of the first PMOS transistor and a potential point at low potential side.

Current corresponding to the current flowing through the first gate resistor flows through the first current path of the first current mirror circuit.

An output voltage is determined based on a voltage drop at the output resistor.

By supplying current to the first gate resistor, a bias is applied to the gate of the first PMOS transistor. Further, the first current mirror circuit functions to supply current corresponding to the current which flowed through the first gate resistor to the source of the first PMOS transistor.

Therefore, current corresponding to the current which flowed through the first gate transistor is supplied to the output resistor which outputs a voltage in response to a voltage drop related to the supplied current.

Furthermore, even during use condition where respective voltages at the first gate resistor are considerably higher than the potential at low potential side, the aforementioned function can be achieved as long as the first PMOS transistor only has a high breakdown voltage without increasing the withstand voltage of the first current mirror circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram illustrating an example of a level shifting circuit according to a first preferred embodiment of the present invention;

FIG. 4 is a circuit diagram illustrating an example of configuration of an output circuit according to a fourth preferred embodiment of the present invention;

DESCRIPTION OF THE PREFERRED EMBODIMENTS

First Preferred Embodiment

Figure 2:
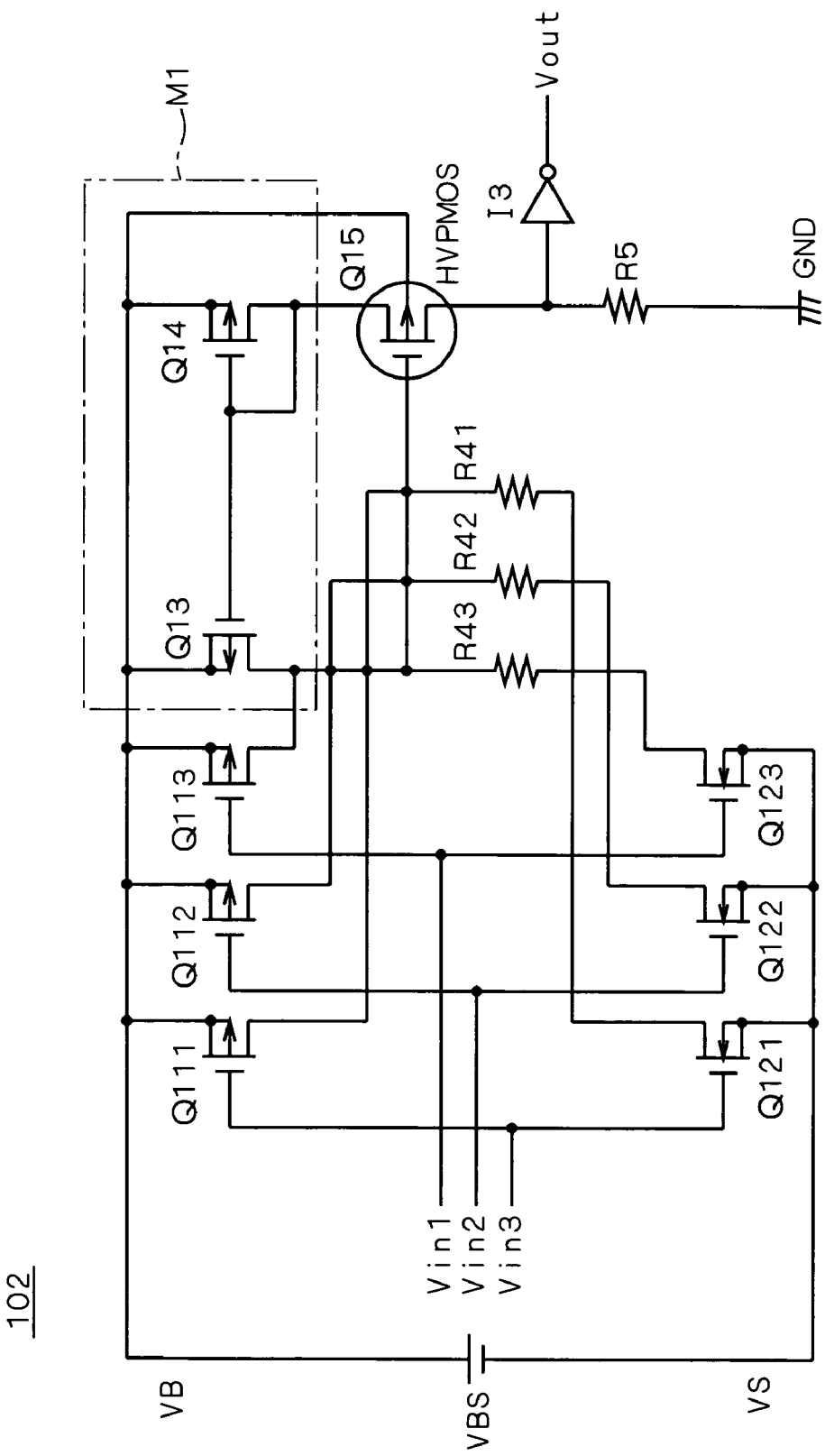
FIG. 2 is a circuit diagram illustrating an example of a level shifting circuit according to a second preferred embodiment of the present invention.

FIG. 1 is a circuit diagram illustrating a level shifting circuit 101 according to a first preferred embodiment of the present invention. For example, this circuit can be employed for transmitting a failure at a high arm side of an inverter circuit to a logic circuit operating at a low voltage.

The level shifting circuit 101 is provided with a first current mirror circuit M1 with first and second current paths each connected to a potential point at high potential side VB. The first and second current paths have, for example, transistors Q13 and Q14, respectively, where the transistor Q14 receives current corresponding to the current flowing through the transistor Q13. The potential point VB is connected, for example, to a positive pole of a power source VBS.

The level shifting circuit 101 is further provided with a high breakdown voltage PMOS (shown as HVPMOS in the drawings) transistor Q15. A source of the transistor Q15 is connected to the potential point VB through the second current path (more specifically, the transistor Q14) of the current mirror circuit M1. A back gate of the transistor Q15 is connected to the potential point VB. The transistor Q15 further includes a drain and a gate.

The level shifting circuit 101 has a gate resistor R4, one end of which is connected to the gate of the transistor Q15.

The level shifting circuit 101 further has a transistor Q12 that is an NMOS transistor. A source of the transistor Q12 is connected to a middle potential point VS. The middle potential point VS is connected, for example, to a negative pole of the power source VBS.

The middle potential point VS supplies a potential of a magnitude between the potential point at high potential side VB and a potential point at low potential side GND. For example, the potential point VB supplies several tens V and the potential point GND supplies 0 V.

A drain of the transistor Q12 is connected to a gate of the PMOS transistor Q15 through the gate resistor R4. An input signal Vin is supplied to a gate of the transistor Q12.

The input signal Vin can be a signal for detecting a short circuit at a high arm side of an inverter, a signal for detecting a voltage reduction at a control power source or a signal for detecting an overcurrent.

The level shifting circuit 101 further has a transistor Q11 that is a PMOS transistor. A source of the transistor Q11 is connected to the potential point VB, a drain of the transistor Q11 is connected to the gate resistor R4 and the gate of the transistor Q15, and a gate of the transistor Q11 is connected to the gate of the transistor Q12.

The level shifting circuit 101 further has an output resistor R5 that is provided between the drain of the transistor Q15 and the potential point at low potential side GND.

The level shifting circuit 101 further has a buffer where a voltage drop at the output resistor R5 is inputted to output a two-valued logic (referred to as "a logic buffer" in the present application), for example, an inverter I3.

Under the configuration of the level shifting circuit 101, when current flows through the gate resistor R4, a bias is applied to the gate of the transistor Q15. Further, current corresponding to the one that flowed through the gate resistor R4 flows through the first current path of the current mirror circuit M1 (specifically, transistor Q13). Then the current mirror circuit M1 functions to supply the second current path (specifically, transistor Q14) and the source of the transistor Q15 with current corresponding to the one that flowed through the gate resistor R4.

For example, since the gate of the transistor Q15 is connected to the potential point VB through the first current path (transistor Q13) of the current mirror circuit M1, current corresponding to the one that flowed through the gate resistor R4 is supplied to the first current path (transistor Q13) of the current mirror circuit M1.

Therefore, current corresponding to the one that flowed through the gate resistor R4 is supplied to the output resistor R5, and a voltage corresponding to a voltage drop related to the supplied current can be outputted. As a result, level shifting can be applied to the input signal Vin for outputting. The inverter I3 serves a function to shape (in this embodiment, further invert) the voltage.

Furthermore, even during use condition where each voltage at both ends of the gate resistor R4 is considerably higher than the potential at low potential side GND, the aforementioned function can be achieved as long as the transistor Q15 only has a high breakdown voltage without increasing the withstand voltage of the current mirror circuit M1.

Especially, in the configuration of the level shifting circuit 101, when the input signal Vin turns on the transistor Q12 (and turns off the transistor Q11), current flows through the gate resistor R4, the first and second current paths of the current mirror circuit M1 (specifically, transistors Q13 and Q14) and the output resistor R5, respectively. In contrast, when the input signal Vin turns off the transistor Q12 (and turns on the transistor Q11), current does not flow through the gate resistor R4. Consequently, current corresponding to the one flowing through the gate resistor R4 does not flow through the first and second current paths of the current mirror circuit M1 (transistors Q13 and Q14) and the output resistor R5, either. Therefore, a voltage drop can be obtained from the output resistor R5 in accordance with the value of the input signal Vin. This allows level shifting to be applied to the input signal Vin for outputting.

Second Preferred Embodiment

FIG. 2 is a circuit diagram illustrating a level shifting circuit 102 according to a second preferred embodiment of the present invention. Similar to the level shifting circuit 101, for example, this circuit can also be employed to transmit a failure at a high arm side of an inverter circuit to a logic circuit operating at a low voltage.

The level shifting circuit 102 has a configuration where inputting part of the level shifting circuit 101 described in the first preferred embodiment is plurally arranged in parallel.

More specifically, in place of the gate resistor R4 employed in the level shifting circuit 101, gate resistors R41, R42, R43 are connected to the gate of the transistor Q15. Further, in place of the transistor Q12 employed in the level shifting circuit 101, the level shifting circuit 102 is provided with transistors Q121, Q122, Q123, all being NMOS transistors. Moreover, in place of the transistor Q11 employed in the level shifting circuit 101, the level shifting circuit 102 is provided with transistors Q111, Q112, Q113, all being PMOS transistors.

The transistor Q121 has a source connected to the middle potential point VS, a drain connected to the gate of the transistor Q15 through the gate resistor R41, and a gate receiving a first input signal Vin1.

The transistor Q122 has a source connected to the middle potential point VS, a drain connected to the gate of the transistor Q15 through the gate resistor R42, and a gate receiving a second input signal Vin2.

The transistor Q123 has a source connected to the middle potential point VS, a drain connected to the gate of the transistor Q15 through the gate resistor R43, and a gate receiving a third input signal Vin3.

The input signals Vin1, Vin2, Vi3 can be a signal for detecting a short circuit at a high arm side of an inverter, a signal for detecting a voltage reduction at a control power source, and a signal for detecting an overcurrent, respectively.

The source of the transistor Q111 is connected to the potential point at high potential side VB, the drain thereof is connected to the gate resistor R41 and the gate of the transistor Q15, and the gate thereof is connected to the gate of the transistor Q121.

The source of the transistor Q112 is connected to the potential point at high potential side VB, the drain thereof is connected to the gate resistor R42 and the gate of the transistor Q15, and the gate thereof is connected to the gate of the transistor Q122.

The source of the transistor Q113 is connected to the potential point at high potential side VB, the drain thereof is connected to the gate resistor R43 and the gate of the transistor Q15, and the gate thereof is connected to the gate of the transistor Q123.

Under the configuration of the level shifting circuit 102, when current flows through the gate resistors R41, R42, R43, a bias is applied to the gate of the transistor Q15. Further, the current that flowed through the gate resistors R41, R42, R43 flows through the first current path of the current mirror circuit M1 (transistor Q13). Then the current mirror circuit M1 functions to provide the source of the transistor Q14 of the second current path with current corresponding to the one that flowed through the gate resistors R41, R42, R43.

Therefore, current corresponding to the one that flowed through the gate resistors R41, R42, R43 is supplied to the output resistor R5, and a voltage corresponding to a voltage drop related to the supplied current can be outputted. As a result, level shifting can be applied to the input signals Vin1, Vin2, Vin3 for outputting. The inverter I3 serves a function to shape (in this embodiment, further invert) the voltage.

Furthermore, even during use condition where all voltages at both ends of respective gate resistors R41, R42, R43 are considerably higher than the potential at low potential side GND, the aforementioned function can be achieved as long as the transistor Q15 only has a high breakdown voltage without increasing the withstand voltage of the current mirror circuit M1.

Under the configuration of the level shifting circuit 102, voltage drops can be obtained from the output resistor R5 in accordance with respective plural input signals. This allows level shifting to be applied to a plurality of input signals for outputting.

Third Preferred Embodiment

Figure 3:
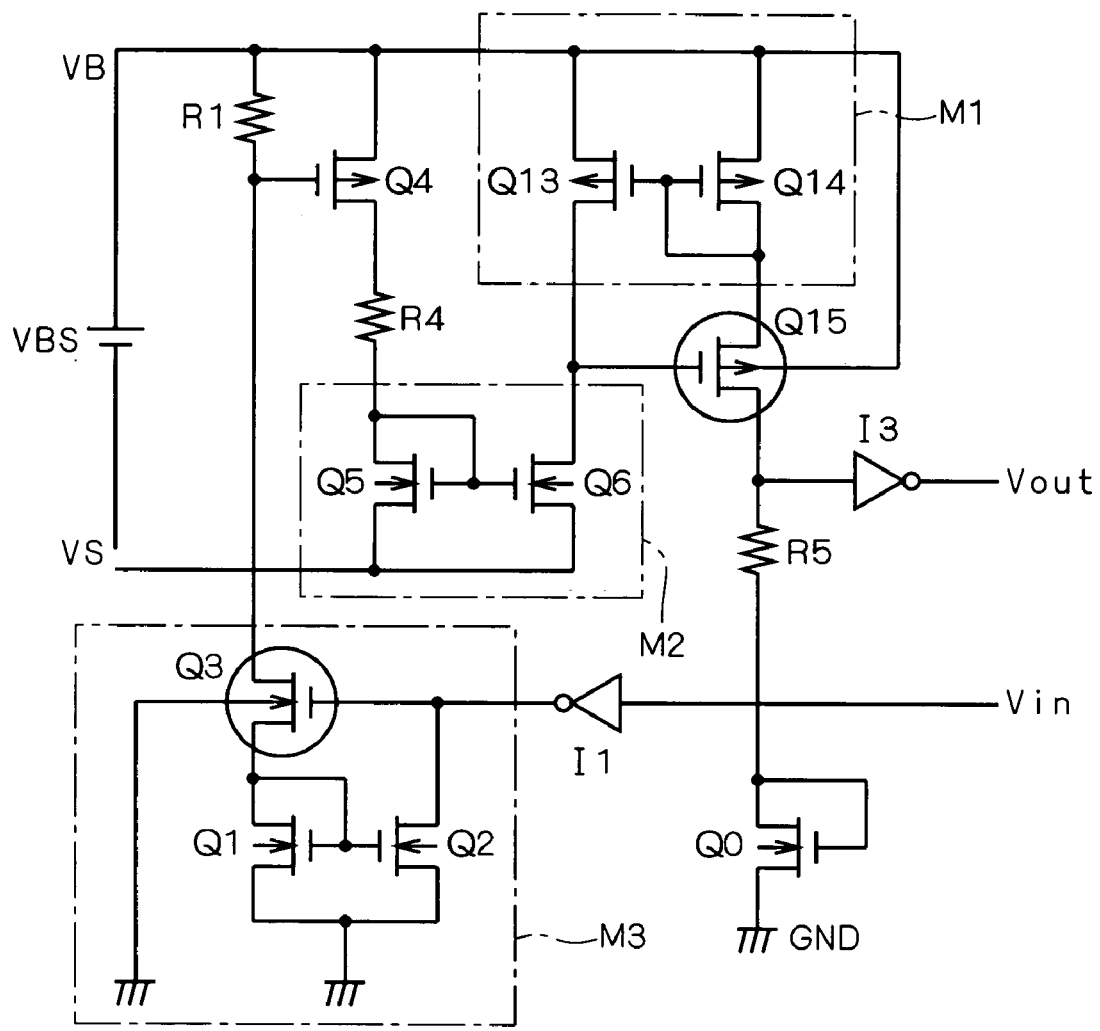
FIG. 3 is a circuit diagram illustrating an example of an output circuit according to a third preferred embodiment of the present invention.

FIG. 3 is a circuit diagram illustrating an output circuit 103 according to a third preferred embodiment of the present invention. For example, this circuit can be employed to monitor a cell voltage of a car battery.

In comparison with the level shifting circuit 101, under the configuration of the output circuit 103, transistors Q11, Q12 are omitted and the connections of the gate resistor R4 are modified. Specifically, both in the level shifting circuit 101 and the output circuit 103, the gate resistor R4 is connected to the gate of the transistor Q15 and the first current path of the current mirror circuit M1. However, the output circuit 103 has a configuration where the gate resistor R4 is connected to the gate of the transistor Q15 and the first current path of the current mirror circuit M1 via a current mirror circuit M2.

The current mirror circuit M2 has first and second current paths each connected to the middle potential point VS. The first and second current paths have, for example in this embodiment, transistors Q5 and Q6, respectively, where the transistor Q6 is supplied with current corresponding to the current flowing through the transistor Q5. In response to the current that flowed through the gate resistor R4, current flows through the first current path (specifically, transistor Q5) and second current path (specifically, transistor Q6) of the mirror circuit M2. Then current flows through the first current path (specifically, transistor Q13) and second current path (specifically, transistor Q14) of the current mirror circuit M1. Passing through the transistor Q15, current flows further through the output resistor R5.

Therefore, also in the configuration of the output circuit 103, even during use condition where each voltage at both ends of the gate resistor R4 is considerably higher than the potential at low potential side GND, it is not necessary to increase the withstand voltage of the current mirror circuits M1 and M2 as long as the transistor Q15 only has a high breakdown voltage.

In place of the transistors Q11 and Q12 in the level shifting circuit 101, the output circuit 103 has a transistor Q4 that is a PMOS transistor, a gate resistor R1 for the transistor Q4, and a current mirror circuit M3.

The gate of the transistor Q4 is connected to the potential point at high potential side VB through the gate resistor R1. A drain of the transistor Q4 is connected to the current mirror circuit M2 through the gate resistor R4. A source of the transistor Q4 is connected to the potential point VB.

The current mirror circuit M3 has a configuration of so-called Wilson current mirror, including a first current path having a transistor Q2 that is an NMOS transistor and a second current path that is connected to the gate of the transistor Q4. The second current path has transistors Q1 and Q3, both of which are NMOS transistors. The first and second current paths of the current mirror circuit M3 are both connected to the potential point at low potential side GND.

Further details of the illustrated configuration of the current mirror circuit M3 are as follows. A source of the transistor Q1 and a source of the transistor Q2 are both connected to the potential point at low potential side GND. A drain and a gate of the transistor Q1, a gate of the transistor Q2, and a source of the transistor Q3 are connected to each other. A drain of the transistor Q2 and a gate of the transistor Q3 are connected to each other. A drain of the transistor Q3 is connected to both the gate resistor R1 and a gate of the transistor Q4. A back gate of the transistor Q3 is connected to the potential point at low potential side GND.

An input signal is supplied to both the drain of the transistor Q2 and the gate of the transistor Q3. For example, illustrated here is the case where the input signal Vin is inputted through an inverter I1 (that is, by inverting the signal).

When the input signal Vin provides a potential of "H" level with the gate of the transistor Q3 and the drain of the transistor Q2, the transistors Q1, Q2 and Q3 turn on. This causes current to flow through the gate resistor R1 (with respect to the transistor Q4) and a resultant voltage drop causes a gate bias to be supplied to the transistor Q4. Then current corresponding to the gate bias flows through the transistor Q4.

The current flowing through the transistor Q4 flows through the gate resistor R4 (with respect to the transistor Q15) and as a result, a voltage drop can be obtained at the output resistor R5 as described above.

Since the output circuit 103 performs in the aforementioned manner, current amount flowing through the gate resistor R4 varies depending on a potential supplied by the power source VBS. By setting values of the gate resistor R1 and the output resistor R5 in advance, the voltage drop at the output resistor R5 can be set to a relatively small voltage in proportion to the potential supplied by the power source VBS. Therefore, if an acceptable lower limit of the potential to be supplied by the power source VBS is set to a threshold value of the inverter I3, an output of the inverter I3 is "H" level when a supplied potential is below the acceptable lower limit and the output of the inverter I3 is "L" level when a supplied potential is above the acceptable lower limit. For example, an instruction for monitoring the power source VBS can be employed as the input signal Vin.

In this manner, when the input signal Vin reaches "L" level, a potential difference between the potential point at high potential side VB and the middle potential point VS, while the level of which being shifted, is reflected to a voltage drop at the output resistor R5, and the result can be transmitted to a logic circuit operating at a low voltage. Furthermore, withstand voltage should be increased only at the transistor Q3 which is located nearest to the gate resistor R1, and it is not necessary to increase withstand voltage at the transistors Q1 and Q2.

Additionally, it is preferable to provide a diode connected between the output resistor R5 and the potential point at low potential side GND from the viewpoint of reverse current prevention. For example, both a gate and a drain of a transistor Q0 that is an NMOS transistor may be connected to the output resistor R5, and a source of the Q0 may be connected to the potential point at low potential side GND.

Fourth Preferred Embodiment

First to third preferred embodiments described a case wherein a voltage drop at the output resistor R5 is regarded as an input level for a logic buffer, for example, the inverter I3. In this case, in the first and second preferred embodiments, level shifting for the input signals Vin, Vin1, Vin2 and Vin3 is performed. In the third preferred embodiment, a potential difference between the potential point at high potential side VB and the middle potential point VS, while the level of which being shifted, is outputted as a logic signal.

Figure 5:
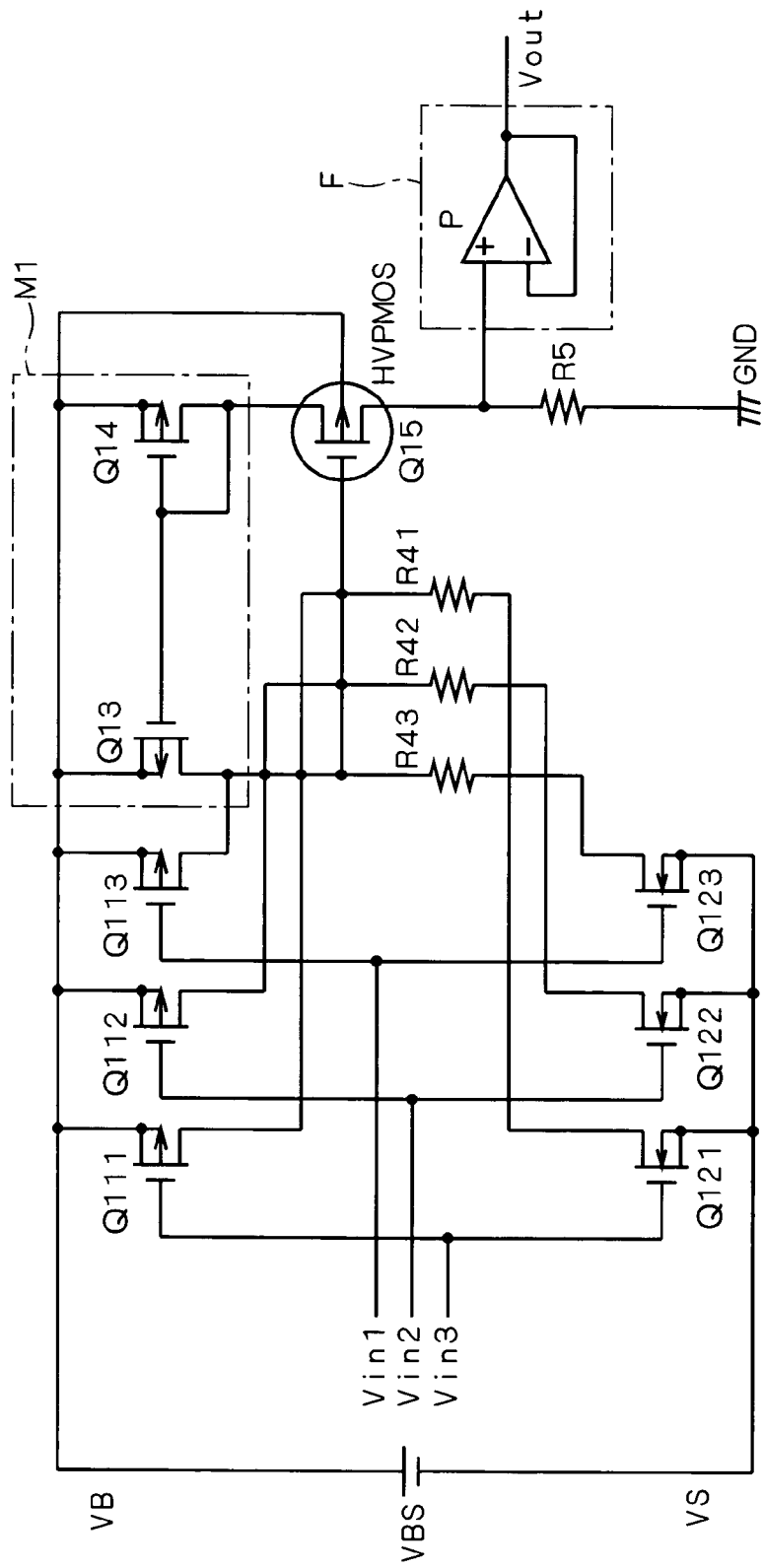
FIG. 5 is a circuit diagram illustrating an example of configuration of an output circuit according to the fourth preferred embodiment of the present invention.
Figure 6:
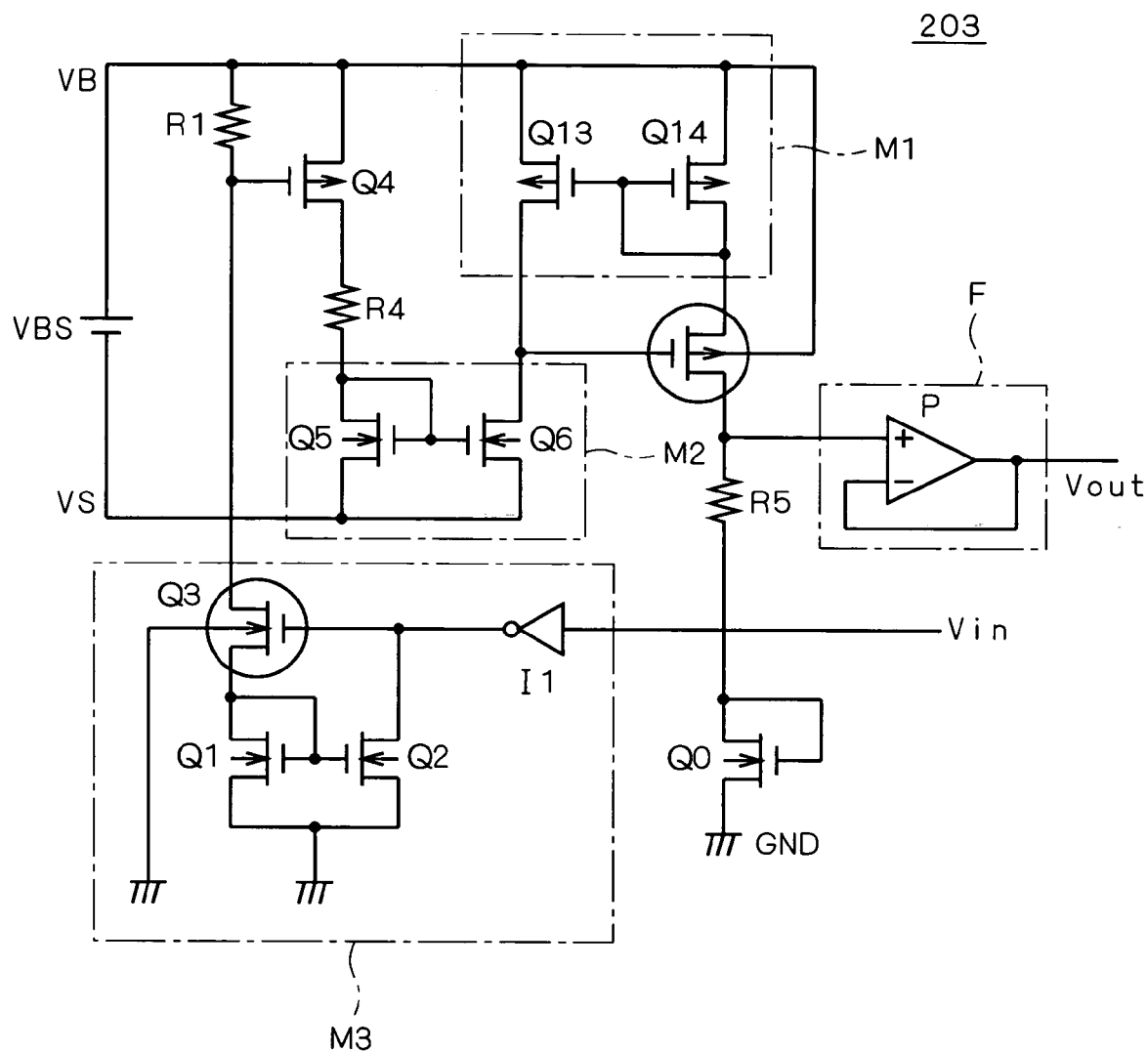
FIG. 6 is a circuit diagram illustrating an example of configuration of an output circuit according to the fourth preferred embodiment of the present invention.

However, it is not necessarily assumed that the circuit of the present invention outputs a logic signal, and the circuit may output an analog voltage. FIGS. 4 through 6 are circuit diagrams illustrating an example of configuration of an output circuit according to the fourth preferred embodiment, and each corresponds to FIGS. 1 through 3, respectively.

FIG. 4 illustrates a configuration of an output circuit 201 wherein the inverter I3 of the level shifting circuit 101 as illustrated in FIG. 1 is replaced with a voltage follower F. This configuration makes it easy to obtain a desirable potential as an output of the output circuit 201.

FIG. 5 illustrates a configuration of an output circuit 202 wherein the inverter I3 of the level shifting circuit 102 as illustrated in FIG. 2 is replaced with a voltage follower F. This configuration makes it easy to obtain a desirable potential as an output of the output circuit 202. Furthermore, by varying the values of the gate resistors R41, R42 and R43 from each other, an output voltage can be varied in response to the values of the input signals Vin1, Vin2 and Vin3. Therefore, it is possible to detect whether the input signals Vin1, Vin2 and Vin3 are active or inactive, individually.

For example, in accordance with the activeness of the input signals Vin1, Vin2 and Vin3, if output voltages are set to 1V, 2V and 4V, respectively, it is of course possible to distinguish the input signals from each other. Further, when the input signals Vin1, Vin2 and Vin3 are active, active and inactive, respectively, then the output voltage is 3V, thereby it is possible to detect if these signals are active or inactive.

FIG. 6 illustrates a configuration of an output circuit 203 wherein the inverter I3 of the output circuit 103 as illustrated in FIG. 3 is replaced with a voltage follower F. This configuration makes it possible to observe a potential difference between the potential point at high potential side VB and the middle potential point VS in a relatively low voltage range.

A circuit using an operation amplifier P can be employed in any of the aforementioned voltage followers F. Specifically, a voltage follower F can be so configured that a voltage drop at the output resistor R5 is inputted into a non-reverse input terminal of the operation amplifier P, and a reverse input terminal and an output terminal are interconnected.

While the invention has been shown and described in detail, the foregoing description is in all aspects illustrative and not restrictive. It is therefore understood that numerous modifications and variations can be devised without departing from the scope of the invention.

What is claimed is:

1. An output circuit, comprising:

a first current mirror circuit having first and second current paths each connected to a potential point at high potential side;

a first PMOS transistor having a drain, a gate, a source and a back gate, said source being connected to said potential point at high potential side through said second current path of said first current mirror circuit, and said back gate being connected to said potential point at high potential side;

a first gate resistor connected to said gate of said first PMOS transistor; and an output resistor connected between said drain of said first PMOS transistor and a potential point at low potential side, wherein current flows through said first current path of said first current mirror circuit corresponding to the current flowing through said first gate resistor, and an output voltage is determined based on a voltage drop at said output resistor, the output circuit further comprising a first NMOS transistor having a source, a drain and a gate, wherein said source is connected to a middle potential point for supplying a potential between said potential point at high potential side and said potential point at low potential side, said drain is connected to said gate of said first PMOS transistor through said first gate resistor, and an input signal is supplied to said gate, the output circuit further comprising:

a second gate resistor; and a second NMOS transistor having a source, a drain and a gate, wherein said source is connected to said middle potential point, said drain is connected to said gate of said first PMOS transistor through said second gate resistor, and another input signal is supplied to said gate.

2. An output circuit, comprising:

a first current mirror circuit having first and second current paths each connected to a potential point at high potential side;

a first PMOS transistor having a drain, a gate, a source and a back gate, said source being connected to said potential point at high potential side through said second current path of said first current mirror circuit, and said back gate being connected to said potential point at high potential side;

a first gate resistor connected to said gate of said first PMOS transistor; and an output resistor connected between said drain of said first PMOS transistor and a potential point at low potential side, wherein current flows through said first current path of said first current mirror circuit corresponding to the current flowing through said first gate resistor, and an output voltage is determined based on a voltage drop at said output resistor, the output circuit further comprising:

a second current mirror circuit having first and second current paths, each of said first and second current paths being connected to said middle potential point for supplying a potential between said potential point at high potential side and said potential point at low potential side, said second current mirror circuit being so arranged that said first gate resistor is connected to said gate of said first PMOS transistor and said first current path of said first current mirror circuit via said second current mirror circuit;

a second gate resistor connected to said potential point at high potential side;

a second PMOS transistor having a gate, a drain and a source, said gate being connected to said potential point at high potential side through said second gate resistor, said drain being connected to said second current mirror circuit through said first gate resistor and said source being connected to said potential point at high potential side; and a third current mirror circuit having first and second paths, said second path being connected to said gate of said second PMOS transistor, said third current mirror circuit being a Wilson current mirror, wherein each of said first and second current paths of said third current mirror circuit is connected to said potential point at low potential side.

3. The output circuit according to claim 1, further comprising a logic buffer for inputting a voltage drop at said output resistor.

4. The output circuit according to claim 2, further comprising a logic buffer for inputting a voltage drop at said output resistor.

5. The output circuit according to claim 1, further comprising a voltage follower for inputting a voltage drop at said output resistor.

6. The output circuit according to claim 2, further comprising a voltage follower for inputting a voltage drop at said output resistor.

* * * * *